United States Patent [19]

Schaake et al.

[11] Patent Number: 4,504,334
[45] Date of Patent: Mar. 12, 1985

[54] GETTERING METHOD FOR MERCURY CADMIUM TELLURIDE

[75] Inventors: Herbert F. Schaake, Denton; John H. Tregilgas, Richardson; Jeffrey D. Beck, Plano, all of Tex.

[73] Assignee: Texas Instruments Incorporated, Dallas, Tex.

[21] Appl. No.: 564,872

[22] Filed: Dec. 23, 1983

[51] Int. Cl.$^3$ .................. H01L 21/324; H01L 21/385
[52] U.S. Cl. ..................................... 148/191; 148/1.5; 148/20.3; 156/DIG. 66; 156/DIG. 72; 156/DIG. 82
[58] Field of Search ............. 148/191, 1.5, 20.3; 156/DIG. 66, DIG. 72, DIG. 73, DIG. 82

[56] References Cited

U.S. PATENT DOCUMENTS

| | | | |
|---|---|---|---|
| 3,954,518 | 5/1976 | Schmit et al. | 148/20.3 |
| 3,963,540 | 6/1976 | Camp, Jr. et al. | 148/20.3 |
| 4,116,725 | 9/1978 | Shimizu | 148/20.3 |
| 4,318,217 | 3/1982 | Jenner et al. | 29/572 |
| 4,435,224 | 3/1984 | Durand | 148/1.5 |

*Primary Examiner*—Aaron Weisstuch
*Attorney, Agent, or Firm*—Robert Groover, III; James T. Comfort; Melvin Sharp

[57] ABSTRACT

The disclosure relates to a method for removing the unwanted impurities from an HgCdTe alloy which consists of the steps of depositing a thin film on the order of from about 1 to about 100 microns in thickness of tellurium onto the backside of a mercury cadmium telluride bar to insure the presence of a substantial amount of excess tellurium on the backside of the alloy bar and allow the gettering mechanism to work. A protective film to shield the tellurium film from mercury ambient atmosphere is then optionally placed over the tellurium film. The protective film can be formed of a silicon oxide such as SiO and is preferably in the range of about 1000 angstroms to 10 microns or more in thickness. The bar with the tellurium and protective film thereon is then annealed at a temperature of less than 450° C., preferably about 280° C., for a period of from about one day to about four weeks in a saturated mercury atmosphere to allow the impurities in the alloy to diffuse to the backside thereof and into the tellurium layer. The bulk of the impurities will travel into the tellurium layer within a matter of several days at the preferred temperature noted hereinabove. The tellurium layer and protective film are then removed such as by grinding, etching or other appropriate method to remove the impurities from the alloy bar.

6 Claims, 4 Drawing Figures 4,504,334

GETTERING METHOD FOR MERCURY CADMIUM TELLURIDE

BACKGROUND OF THE INVENTION

1. Field of the Invention

This invention relates to the preparation of semiconductor alloys of the formula $Hg_{(1-x)}Cd_xTe_1$, where "x" is in the range from 0.14 to 0.40 for infrared applications, generically referred to as "HgCdTe".

2. Description of the Prior Art

Alloys composed of mercury, cadmium, and tellurium and having the general formulation set forth hereinabove have been reported in the prior art, particularly in regard to their semiconductor properties and their use in conjunction with infrared detectors and the like. These materials often include mobile residual impurities of undesirable types which can act as dopants and also can limit the performance or contribute to a decrease of normal life expectancy of any device produced from the alloy. The most common manifestation of impurity found in HgCdTe alloys is an acceptor which commonly exists in the mid $10_{15}/cm^3$ range and a residual donor impurity commonly in the range of $1-10\times10^{14}/cm^3$ range. During quenching the alloys from high temperatures, precipitates are formed everywhere in the alloy. The subsequent low temperature post-anneal step in-diffuses Hg which annihilates the tellurium precipitates near the alloy surface, leaving a core region which is P-type due to being saturated with excess Te. If a core is left, this is because the post-anneal was not continued long enough since annihilation of the excess tellurium takes place from the surface toward the central region during post annealing. The residual acceptor impurities may be gettered into the core retgion of the alloy in a known manner, the core region normally being a region of excess or second phase tellurium which remains after the post-annealing step in a saturated mercury ambient atmosphere as noted above. Presence of the core during the in-diffusion of Hg results in a net migration of acceptor impurities into the core region. The result is an N-type skin on the surface of the alloy with a typical carrier concentration in the surface retion in the mid $10^{14}/cm^3$ region. When the core is annihilated by prolonged post-annealing or the like, as is discussed in greater detail in copending application Ser. No. 564,953, filed Dec. 23, 1983 (TI-9916), the second phase and excess tellurium are initially removed and then the impurities will tend to migrate homogeneously throughout the alloy by solid state diffusion. This does not present a problem when the impurities are desirable and required as a dopant in the existing concentrations. However, these impurities, normally being in the form of acceptor impurities, are released from the core region, and can result in a conversion of the surface of the alloy back to P-type in the mid $10^{15}/cm^3$ range. It is, therefore, clear from the above discussion that it is desirable and often necessary that the unwanted impurities can be removed from the HgCdTe alloy.

In current practice, to the knowledge of the applicants herein, there are no conscious attempts being made to getter impurities in HgCdTe and physically remove them from the system. Some attempts have been made to remove the impurities by mechanical backside damage; however, current theoretical experimental understanding suggests that this approach will be unsuccesful.

SUMMARY OF THE INVENTION

In accordance with the present invention, there is provided a method for removing the unwanted impurities from an HgCdTe alloy of the type described hereinabove which is relatively simple to accomplish. The invention consists of the steps of depositing a thin film on the order of from about 1 to about 100 microns in thickness, this thickness not being critical, of tellurium onto the backside of a mercury cadmium telluride bar. Since the tellurium appears to attract the impurities thereto, this will insure the presence of a substantial amount of excess tellurium on the backside of the alloy bar and allow the gettering mechanism to work, regardless of which the mechanism may be. A protection film to shield the tellurium film from mercury ambient atmosphere is then optionally placed over the tellurium film. The protective film can be formed of a silicon oxide such as $SiO_x$ and is preferably in the range of about 1000 A to 10 microns or more in thickness. The main requirement of the protective film is that it be stable at the annealing temperature and that it not contaminate the front side of the HgCdTe bar to an appreciable depth by surface diffusion or vapor transport. The bar with the tellurium and protective film thereon is then annealed at a temperature of less than 450 degrees C., preferably about 270 degrees C., for a period of from about one day to about four weeks in a saturated mercury atmosphere. This allows the impurities in the alloy to diffuse to the backside thereof and perhaps into the tellurium layer. The bulk of the impurities will be gettered out of the front surface region in a matter of several hours, and travel to the back surface within a period of several days, it being understood that the annealing period will be increased with decreased temperature. The tellurium layer and protective film are then removed such as by grinding, etching, or other appropriate method to remove the impurities from the alloy bar.

DESCRIPTION OF THE PREFERRED EMBODIMENT

Figure 1:
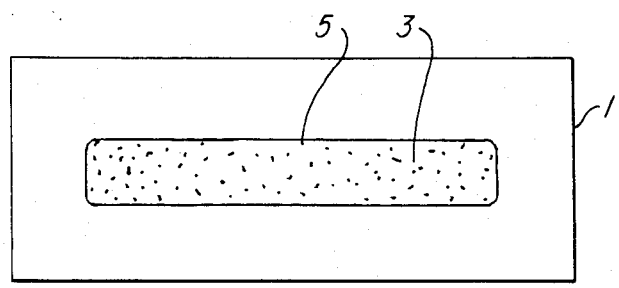
FIG. 1 is a schematic diagram showing a cross-section of an HgCdTe bar with a core therein containing second phase tellurium and impurities.

Referring now to FIG. 1, there is shown a mercury cadmium telluride bar 1 having a core 3 which includes second phase tellurium and impurities 5 therein. The method of formation of the structure of FIG. 1 is known and is described in greater detail in the above identified copending application. Briefly, this structure is provided by forming an ingot of mercury cadmium telluride by placing appropriate amounts of mercury, cadmium, and tellurium into a quartz ampoule and heating the ampoule in excess of 800 degrees C. to the liquid phase, maintaining the temperature of the liquid for about half a day, and shaking the ampoule. After cooling, the ingot then undergoes an annealing step at a temperature in excess of 650 degrees C. and below the crystal melting point to provide for recrystallization and homogenization thereof. The ingot is then cut into slices or bars and annealed for a second time in a saturated mercury vapor atmosphere at below 450 degrees C. and preferably about 280 degrees C. to form the core 3 of second phase tellurium and impurities 5. Other methods of making HgCdTe are known to those practiced in the art and similarly employ the low temperature annealing step below to achieve a reduction of metal vacancies.

Figure 2:
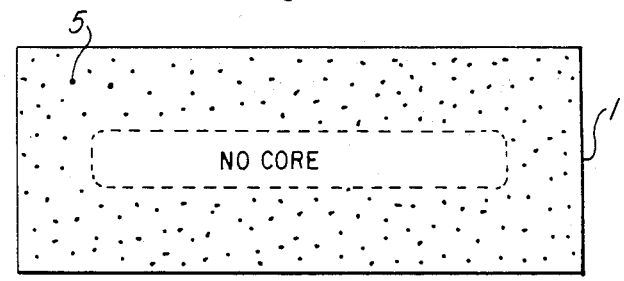
FIG. 2 is a diagram as in FIG. 1 after annihilation of the second phasae tellurium from the core.

The bar of FIG. 1 is then subjected to a further post-anneal at a temperature below about 450 degrees C., preferably 280 degrees C., for a period of from about one week to about 20 weeks. The result of this annealing step is shown in FIG. 2 wherein it can be seen that the core 3 has been removed in that the tellurium has been removed or annihilated from the bar 1. However, the impurities 5 remain within the bar 1 except that they are now dispersed throughout the bar by solid state diffusion.

A tellurium layer 7 is now formed on the back surface 11 of the bar 1, this tellurium layer having a thickness of about 1 micrometer to about 100 micrometers, though the thickness of this layer is not critical. The layer 7 need merely be thick enough so as not to be converted to HgTe by in-diffusing Hg. The tellurium layer 7 attracts the impurities within the HgCdTe bar 1 in the saturated mercury vapor atmosphere in the same manner that the core 3 formed of second phase tellurium had a tendency to attract the impurities thereto. If desired, a protective film 9 is provided over the entire tellurium layer 7 to shield the tellurium layer from the saturated mercury vapor ambient during the following annealing step. The protective film is preferably a silicon oxide such as SiO, though any material which is stable at the annealing temperature and does not contaminate the front surface 13 of the bar 1 to an appreciable depth by surface diffusion or vapor transport or the like can be used.

Figure 3:
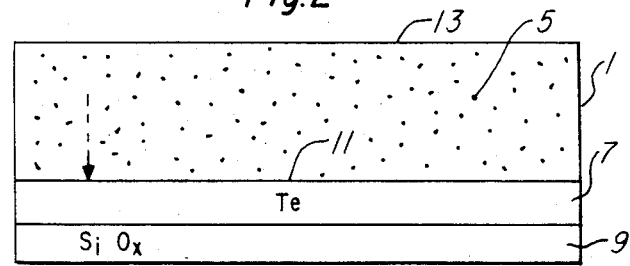
FIG. 3 is a cross-sectional view of the HgCdTe bar of FIG. 2 with the addition of a tellurium and protective film layer.

This arrangement shown in FIG. 3 is then annealed at a temperature of less than 450 degrees C. for from about a day up to about four weeks in a saturated mercury vapor atmosphere. The combination of the tellurium layer 7 an the saturated mercury vapor atmosphere will drive the impurities in the bar 1 toward the tellurium layer. Most of the impurities will probably enter the tellurium layer 7 in a period of several days when annealing at a temperature of about 280 degrees C., it being understood, as noted above, that, with lower annealing temperatures, the annealing time will increase as is well known in the art.

Figure 4:
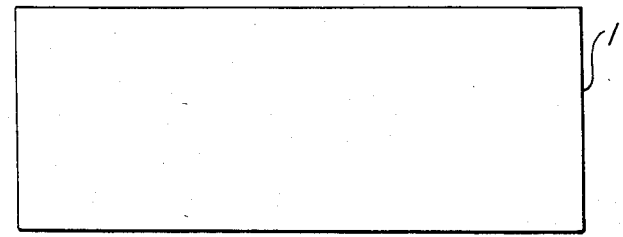
FIG. 4 is a view of the HgCdTe bar of FIG. 3 after removal of impurities and the tellurium and protective film layers.

After the annealing step on the arrangement of FIG. 3 has been completed, the FIG. 3 arrangement is cooled and the tellurium layer 7 with impurities 5 therein and the protective film 9 are removed by grinding, etching, or the like to provide a substantially impurity free bar 1 as shown in FIG. 4. Polishing of the front surface 1 in FIG. 3 may also be performed if shallow contamination of the front surface has occurred from vapor transport or surface diffusion from the protective backside layer 7 in FIG. 3.

It can be seen that there has been provided a relatively simple method for removal of undesirable impurities from a mercury cadmium telluride bar.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of removing impurities from a HgCdTe member comprising the steps of:
    (a) providing a HgCdTe member having impurities substantially uniformly dispersed therethrough;
    (b) forming a tellurium layer on a portion of the exposed surface of said member;
    (c) annealing the member resulting from step (b) at a temperature less than about 450 degrees C. in a saturated mercury atmosphere for a period of from about one day to about four weeks; and
    (d) removing said tellurium layer and impurities in an adjacent layer thereto.

2. A method as set forth in claim 1 further including the step of placing a protective film stable at said annealing temperature and not a contaminant to said member over said tellurium layer after step (b).

3. A method as set forth in claim 2 wherein said film is a silicon oxide.

4. A method as set forth in claim 3 wherein the thickness of said tellurium layer is in the range of from about 1 micrometer to about 100 micrometers.

5. A method as set forth in claim 2 wherein the thickness of said tellurium layer is in the range of from about 1 micrometer to about 100 micrometers.

6. A method as set forth in claim 1 wherein the thickness of said tellurium layer is in the range of from about 1 micrometer to about 100 micrometers.

* * * * *